United States Patent
Ebeshu et al.

Patent Number: 6,035,410
Date of Patent: Mar. 7, 2000

[54] MICROPROCESSOR WITH REDUCED POWER CONSUMPTION IN ACCORDANCE WITH USAGE CONDITION

[75] Inventors: Hidetaka Ebeshu; Kouji Arai, both of Kawasaki, Japan

[73] Assignee: Fujitsu Limited, Kawasaki, Japan

[21] Appl. No.: 08/947,872

[22] Filed: Oct. 9, 1997

[30] Foreign Application Priority Data

Apr. 30, 1997 [JP] Japan .................................. 9-112824

[51] Int. Cl.⁷ ...................................................... G06F 1/08
[52] U.S. Cl. ........................................... 713/501; 713/601
[58] Field of Search .................................. 395/556, 559, 395/560, 750.04; 713/501, 600, 601

[56] References Cited

U.S. PATENT DOCUMENTS

| | | | |
|---|---|---|---|
| 4,893,271 | 1/1990 | Davis et al. | 364/900 |
| 5,774,701 | 6/1998 | Matsui et al. | 395/556 |
| 5,778,237 | 7/1998 | Yamamoto et al. | 395/750.04 |

FOREIGN PATENT DOCUMENTS

| | | |
|---|---|---|
| 59-122223 | 7/1984 | Japan . |
| 60-502274 | 12/1985 | Japan . |
| 85/02275 | 5/1985 | WIPO . |

*Primary Examiner*—Dennis M. Butler
*Attorney, Agent, or Firm*—Staas & Halsey LLP

[57] ABSTRACT

A microprocessor that includes a processor (6) for executing an instruction in accordance with an internal clock signal, an instructing section (3) for outputting a frequency multiplication rate instructing signal corresponding to the data output from the processor, and a data selecting section (2) for selectively outputting the frequency multiplication rate instructing signal. A PLL section changes the frequency of the internal clock signal in response to the frequency multiplication rate instructing signal output from the data selecting section. Inhibiting section inhibits the internal clock signal from being supplied from a PLL section to the processor for a predetermined period until the frequency of the internal clock signal in the PLL section becomes stable.

6 Claims, 3 Drawing Sheets

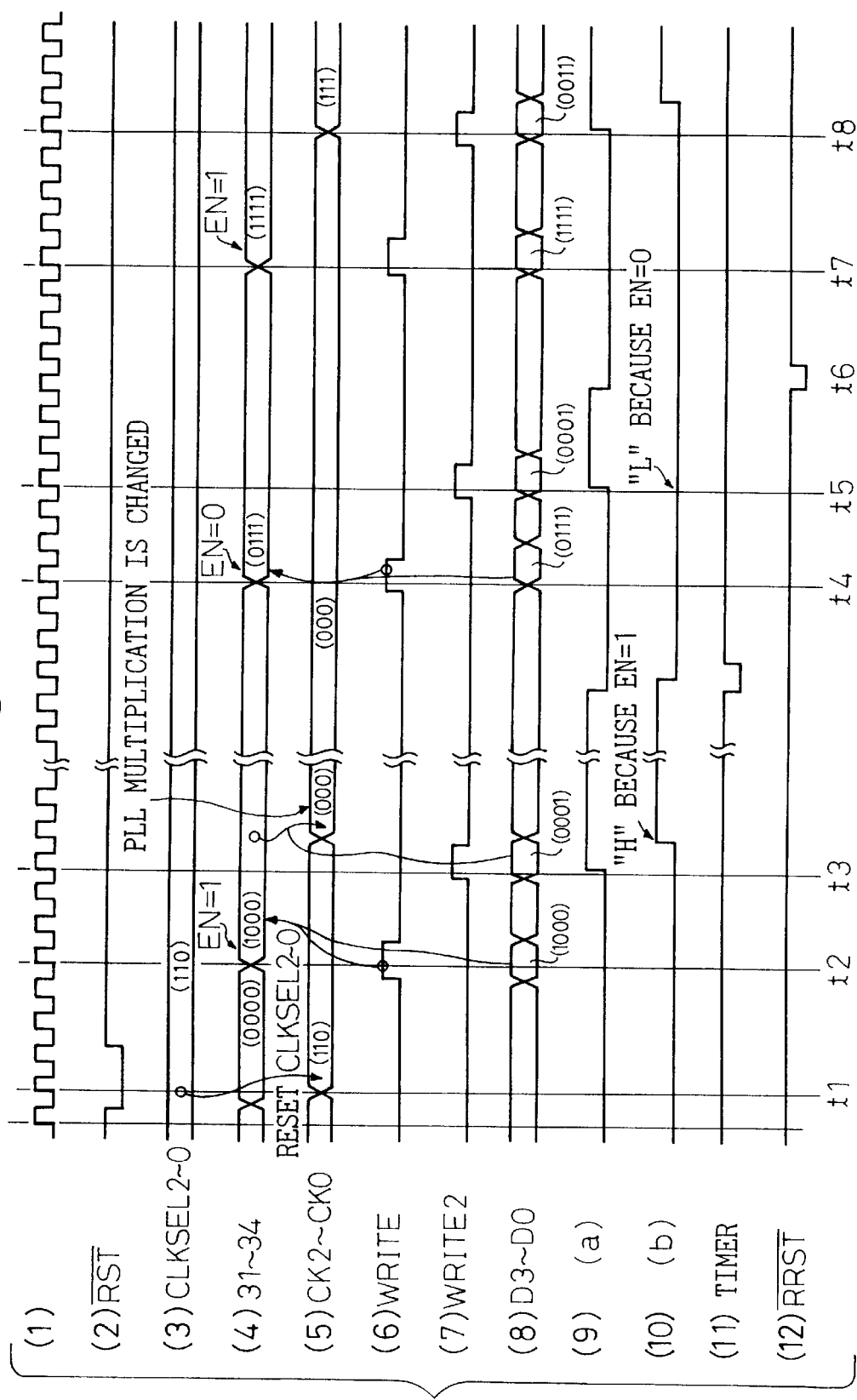

MICROPROCESSOR WITH REDUCED POWER CONSUMPTION IN ACCORDANCE WITH USAGE CONDITION

BACKGROUND OF THE INVENTION

1. Field of the Invention

The present invention relates to a microprocessor with a power consumption which can be reduced by changing the frequency of an internal clock signal of a PLL ("Phase-Locked Loop") section in accordance with a microprocessor usage condition.

In recent years, small-sized apparatuses, such as portable devices, in which microprocessors are used, have become increasingly popular. Therefore, it has been required to reduce the power consumption in the microprocessor.

In general, a microprocessor includes a PLL section for generating an internal clock signal in response to an external clock signal, and a processor for executing an instruction in response to the internal clock signal supplied from the PLL section. Regarding microprocessors, there are two types: i.e., a built-in PLL section type in which the PLL section is mounted on a processor chip, and an external PLL section type in which the PLL section is arranged outside of the processor chip. The microprocessor referred to in this specification represents a microprocessor including a PLL section, regardless of whether it is the built-in PLL section type or the external PLL section type.

2. Description of the Related Art

As prior arts, a Japanese Laid Open Patent Publication (Kokai) No. 59-122223 and an international publication WO85/02275 disclose a PLL section which outputs a clock signal which is divided by a processor to lower the frequency of the clock signal used in the processor, so as to reduce the power consumption. In these prior arts, however, the frequency of the clock signal for operating the PLL section is fixed to the maximum frequency, so that the power consumption in the PLL section is still large.

Therefore, in the prior art microprocessor, even though the operating speed of the processor itself is lowered to reduce the power consumption, there is a disadvantage in that the power consumption in the PLL section is still large.

SUMMARY OF THE INVENTION

An object of the present invention is to provide a microprocessor in which the total power consumption can be further reduced by reducing the power consumption in a PLL section when the power consumption of a processor is to be reduced by lowering the operating speed of the processor.

To attain the above object, there is provided, according to the present invention, a microprocessor with reduced power consumption in accordance with the usage condition, comprising: a PLL section for generating an internal clock signal based on an external clock signal, the PLL section being operated in accordance with the internal clock signal; a processor for executing an instruction in accordance with the internal clock signal supplied from the PLL section; an instructing section for latching data output from the processor by the execution of the instruction, and for outputting a frequency multiplication rate instructing signal corresponding to the latched data and an enable signal for determining whether or not the multiplication rate should be changed; a data selecting section for selectively outputting the frequency multiplication rate instructing signal or an external clock selecting signal in accordance with the enable signal; and an inhibiting section for inhibiting the internal clock signal to be supplied from the PLL section to the processor for a predetermined period from a time of the output of the enable signal to a time when the frequency of the internal clock signal in the PLL section becomes stable; the PLL section changing the frequency of the internal clock signal in response to the data selectively output from the data selecting section.

The data output from the processor includes information corresponding to the operating speed of the processor. That is, the information includes a signal for instructing the frequency multiplication rate of the clock signal, and an enable signal for determining whether or not a request for changing the frequency of the clock signal should be issued. The instructing section outputs the frequency multiplication rate instructing signal and the enable signal in accordance with the data output from the processor. When the enable signal is, for example, an "H" (high) level, it indicates that the operating speed of the microprocessor should be changed. When the enable signal is "L" (low) level, it indicates that the operating speed of the microprocessor should not be changed. When the enable signal is at the "H" level, the data selecting section selectively outputs the frequency multiplication rate instructing signal to the PLL section. The PLL section changes the frequency of its internal clock signal in accordance with the frequency multiplication rate instruction signal. During the process of changing the frequency of the internal clock signal, the PLL section may be temporarily unlocked so that the frequency of the output internal clock signal may be unstable. Therefore, during this period, the inhibiting section inhibits supply of the internal clock signal from the PLL section to the processor, and after the output of the PLL section becomes stable, the internal clock signal from the PLL section is supplied to the processor.

Thus, the frequency of the internal clock signal generated by the PLL section is changed in accordance with the output data from the processor, and the PLL section and the processor are operated in accordance with the internal clock signal, whereby when the PLL section operates at a low speed, the processor is also operated at the low speed, resulting in that the power consumption of the microprocessor as a whole can be greatly reduced.

BRIEF DESCRIPTION OF THE DRAWINGS

The above object and features of the present invention will be more apparent from the following description of the preferred embodiments when read in conjunction with the accompanying drawings, wherein:

FIG. 3 is a timing chart for explaining the operation of the circuit shown in FIG. 2.

DESCRIPTION OF THE PREFERRED EMBODIMENTS

Figure 1:
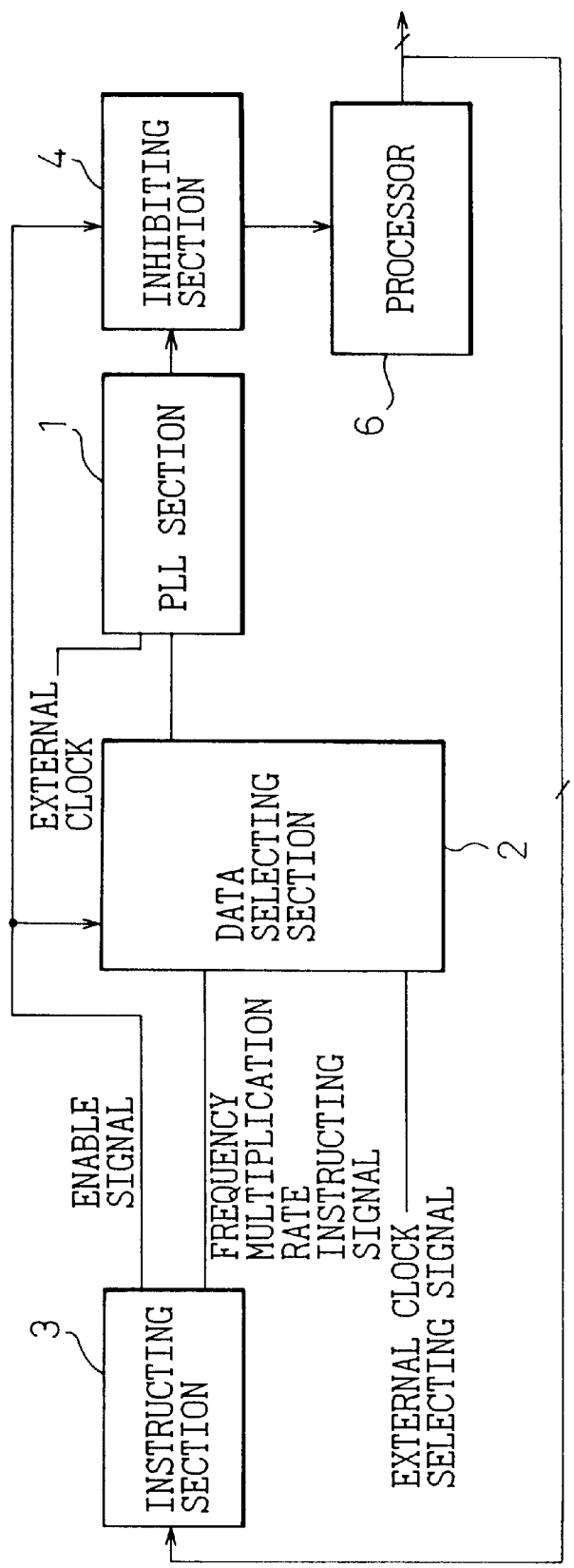
FIG. 1 is a block diagram generally showing a microprocessor according to the present invention.

FIG. 1 is a block diagram generally showing a microprocessor according to the present invention. In FIG. 1, reference numeral 1 denotes a PLL section for generating an internal clock signal in response to an external clock signal; 2 denotes a data selecting section; 3 denotes an instructing section for latching data output from a processor 6 when an instruction is executed by the processor 6, and for outputting a frequency multiplication rate instructing signal corresponding to the latched data and for outputting an enable signal which determines whether or not the multiplication rate should be changed; and 4 denotes an inhibiting section for inhibiting the supply of the internal clock signal from the PLL section 1 to the processor 6 during a predetermined time period from the time when the enable signal is output to the time when the frequency of the internal clock signal for the PLL section 1 becomes stable.

In this present embodiment, the enable signal is made to correspond to the most significant bit of the output data from the processor 6, however, it may be made to correspond to any bit in the output data from the processor 6. In response to the enable signal, the data selecting section 2 outputs either one of the frequency multiplication rate instructing signal from the instructing section 3 or an externally supplied external clock selecting signal having a predetermined constant multiplication rate, in accordance with the enable signal.

In operation, the processor 6 executes various instructions in accordance with the internal clock signal supplied from the PLL section 1. The data obtained from the executions of the instructions are supplied to a unit (not shown) to be processed, as well as to the instructing section 3. The instructing section 3 latches the data and outputs the enable signal and the frequency multiplication instructing signal which correspond to the latched data. For example, the most significant bit of the latched data becomes the enable signal, and the remaining data in the latched data become the frequency multiplication rate instructing signal. In this preferred embodiment, the processor 6 is so designed that the processor 6 makes the most significant bit of the output data to be at an "L" (low) level when the frequency of the internal clock signal should not to be changed; and the most significant bit is made to be at an "H" (high) level when the frequency of the internal clock signal should be changed.

When the enable signal is at the "H" level, the data selecting section 2 selectively outputs the frequency multiplication rate instructing signal received from the instructing section 3 to the PLL section 1. Based on the received frequency multiplication rate instructing signal, the PLL section 1 generates an internal clock signal having a multiplication rate corresponding to the frequency multiplication instructing signal, the multiplication rate being obtained by changing the frequency of the external clock signal. During a predetermined period from the time when the enable signal becomes the "H" level to the time when the output of the PLL section 1 becomes stable, the inhibiting section 4 inhibits the output of the PLL section 1 from being supplied to the processor 6. After the inhibiting period of the inhibiting section 4, the internal clock signal from the PLL section 1 is supplied to the processor 6. The PLL section 1 then executes necessary procedures based on the new internal clock signal.

When the enable signal is at the "L" level, the data selecting section 2 selectively outputs the predetermined external clock selecting signal to the PLL section 1. The PLL section 1 generates an internal clock signal having a predetermined constant multiplication rate corresponding to the received external clock selecting signal. In response to the internal clock signal, the PLL section 1 and the processor 6 operate.

Figure 2:
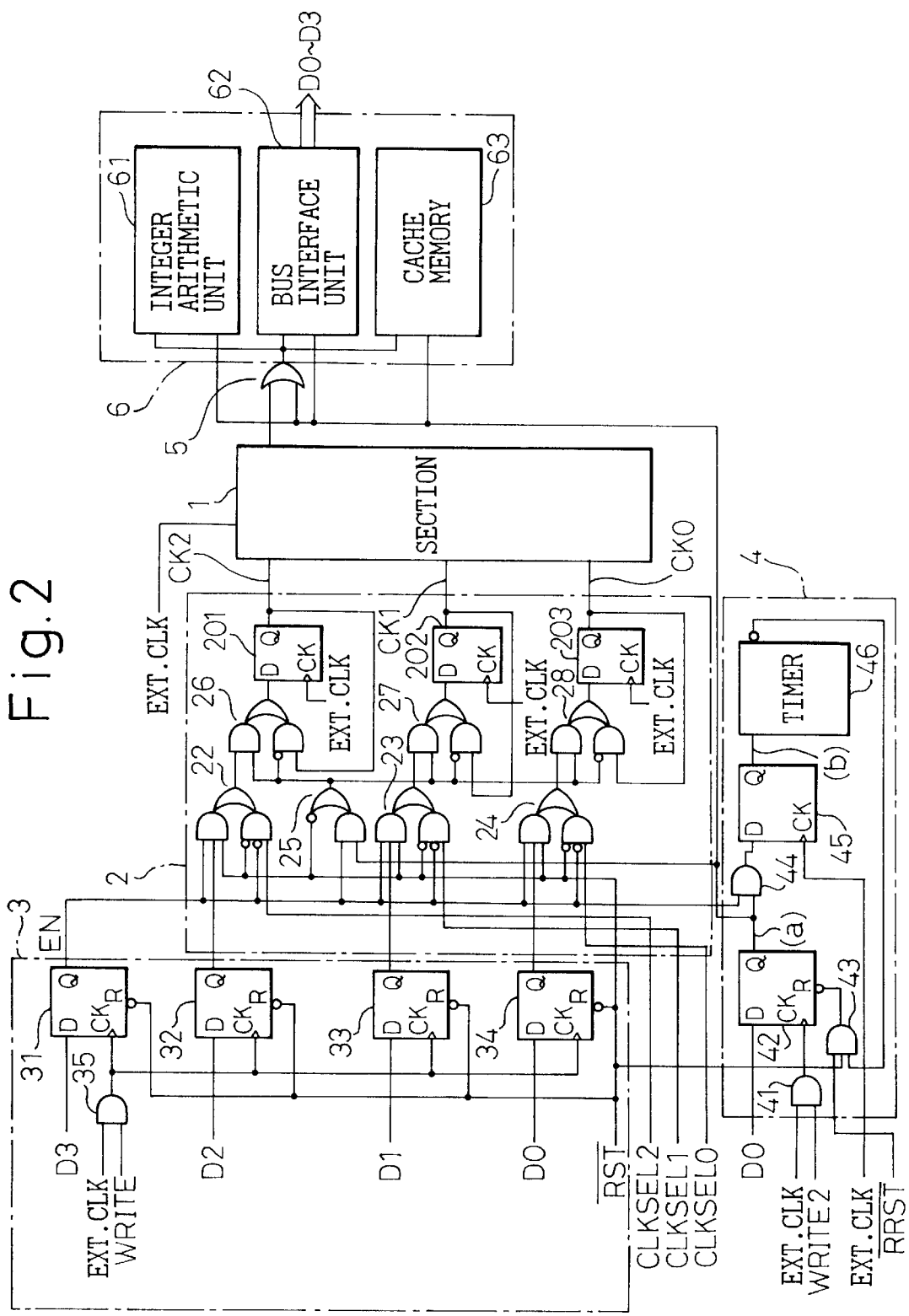
FIG. 2 is a logic circuit diagram showing in detail the microprocessor shown in FIG. 1.

FIG. 2 is a logic circuit diagram showing in detail the microprocessor shown in FIG. 1. In the figure, the same parts as those in FIG. 1 are denoted by the same reference numerals.

In this embodiment, it is assumed that the processor 6 outputs four-bit data D3–D0. The processor 6 includes various well-known units such as an integer arithmetic unit 61, a bus interface unit 62, a cache memory 63, and the like.

The instructing section 3 is a register consisting of four flip-flops 31–34 and an AND gate 35. To the AND gate 35, an external clock signal CLK and a write signal WRITE are input. The write signal WRITE is output from the processor 6 at a timing when an output data is written into the instructing section 3 after an instruction is executed by the processor 6. The output of the AND gate 35 is commonly connected to clock terminals CK of the flip-flops 31–24. Each of the flip-flops 31–35 has a reset terminal R which receives an inverted signal of a reset signal RST (hereinafter referred to as a reset signal RST bar). The reset signal RST bar is an initializing signal which is at the "L" level when the microprocessor is initialized. The data D3–D0 output from the processor 6 are respectively input into data input D of the flip-flops 31–34. The most significant bit D3 of the data D3–D0 is latched by the flip-flop 31, and is output in this embodiment as an enable signal EN.

The data selecting section 2 includes three first gates 22–24, a second gate 25, three third gates 26–28, and three flip-flops 201–203. The first gates 22–24 respectively pass the output of the flip-flops 32–34 when both the enable signal EN and the reset signal RST bar are at the "H" level, and pass external clock selecting signals CLKSEL2, CLKSEL1, and CLKSEL0 from the respective external terminals when both the enable signal EN and the reset signal RST bar are at the "L" level. The gate 25 outputs the "H" level signal when both the enable signal EN and the output of a flip-flop 42 (hereinafter described in more detail) are at the "H" level or when the reset signal RST bar is at the "L" level. The gates 26–28 respectively output the "H" level signals when the outputs of the gates 22–24 are respectively at the "H" level and the output of the gate 25 is at the "H" level, or when the output of the gate 25 is at the "L" level and the outputs of the flip-flops 201–203 are respectively at the "H" level. The flip-flops 201–203 respectively latch the outputs of the gates 26–28 to output the frequency multiplication rate instructing signals CK2, CK1, and CK0.

The inhibiting section 4 includes an AND gate 41, the flip-flop 42, and an AND gate 43. The AND gate 41 passes a second write signal WRITE2 in response to the external clock signal CLK. The flip-flop 42 receives at its clock terminal CK the output of the AND gate 41 to latch data D0. The AND gate 43 receives the reset signal RST bar, a second reset signal PRST bar and the output of the timer 46. The second reset signal PRST bar is a signal supplied externally at an arbitral timing after the enable signal EN is turned to the "L" level and when the inhibiting operation of the processor 6 is to be released, so as to clear the contents of the flip-flop 42, and the output of a timer 46. The AND gate 43 outputs a logical product signal of these input signals to a reset terminal R of the flip-flop 42. The inhibiting section 4 further includes an AND gate 44 which receives the enable signal EN and the output of the flip-flop 42, a flip-flop 45 for latching the output of the AND gate 44 in response to the external clock signal CLK, and the above-mentioned timer 46 for counting a predetermined time after the output of the flip-flop 45 returns to the "H" level. The output of the flip-flop 42 is input to one of the inputs of an OR gate 5, while the other input of the OR gate 5 receives the output of the PLL section 1. The output of the OR gate 5 is input to the integral arithmetic unit 61, the bus interface unit 62, and the cache memory 63. The output of the flip-flop 42 is also input directly to each unit in the processor 6 so as to be used to prevent malfunction during a period when the internal clock signal is not supplied to said each unit.

Next, the operation of the circuit shown in FIG. 2 is described with reference to a timing chart shown in FIG. 3.

First, when the reset signal RST bar is turned to the "L" level at a time immediately before a time t1, the contents in the flip-flops 31–34 are reset to become "0000" (see FIG. 3 (4)). It is assumed that, at the time t1, the external clock selecting signals CLKSEL2–CLKSEL0 from the external terminals are "110" (see FIG. 3 (3)). At the time t1, since the enable signal EN, which is the output of the flip-flop 31, is "0" and the reset signal RST bar is at the "L" level, the clock selecting signals CLKSEL2–CLKSEL0 ("110") pass through the gates 22–24 in the data selecting section 2, and also the output of the gate 25 turns to the "H" level. Because the output of the gate 25 is at the "H" level, the clock selecting signals CLKSEL2–CLKSEL0 ("110") pass through the gates 26–28 to be latched as CK2–CK0 in the flip-flops 201–203. The PLL section 1 generates an internal clock signal corresponding to the output CK2–CK0 (see FIG. 3 (5)) of the flip-flops 201–203, that is, in this case, corresponding to the external clock selecting signals "110". The PLL section 1 operates in response to the generated internal clock signal, as well as outputs the internal clock signal. The frequency of the internal clock signal at this time is set to be a high frequency of, for example, four times higher than the external clock signal CLK. The internal clock signal is input to one of the inputs of the OR gate 5. At the other input of the OR gate 5, the output of the flip-flop 42 is input. Since the reset signal RST bar is at the "L" level at this time, the flip-flop 42 is in a reset state so that its output is at the "L" level. Therefore, the output of the PLL section 1 passes through the OR gate 5 to be input to each unit in the processor 6. Thus, the processor 6 executes various instructions in response to the internal clock signal. In this connection, when the output of the flip-flop 42 is at the "L" level, the "L" level signal is directly input to each unit in the processor 6 so that it is ensured that the operation of each unit is not disturbed by the supply of the internal clock signal.

Next, at a time t2, it is assumed that the output data D3–D0 of the processor 6 has been changed to "1000". When the output data has been changed, a write signal WRITE (see FIG. 3 (6)) for writing the output data into the register consisting of the flip-flops 31–34 is output from the processor 6. Then the external clock signal CLK passes through the AND gate 35 arranged at the input side of the register so that the flip-flops 31–34 latch the output data D3–D0 ("1000") from the processor 6 in response to the external clock signal CLK. As a result, the output of the flip-flop 31, i.e., the enable signal EN, is changed to "1" so that the outputs of the flip-flops 32–34 pass through the gates 22–24. At this time point, however, the flip-flop 42 remains in the reset state so that its output is at the "L" level. Therefore, an AND gate in the gate 25 receives at its one input the "H" level of the enable signal EN and at its other input the "L" level of the output of the flip-flop 42, so that the output of the said AND gate is at the "L" level which is then input to one of the inputs of the OR gate in the gate 25. To the other input of the said OR gate, the "H" level of the reset signal RST bar is inverted and input. Therefore, the output of the said OR gate is at the "L" level. Thus, the outputs of the gates 22–24 do not pass through the gates 26–28, holding the output signals CK2–CK0 of the flip-flops 201–203 at "110".

Then at a time t3, it is assumed that the processor 6 outputs "0001" as its output data D3–D0. Then, an "H" level pulse of the second write signal WRITE2 (see FIG. 3 (7)) for writing the least significant bit D0 that is "1" at this time into the flip-flop 42 is output from the processor 6 (see FIG. 3 (8)). The second write signal WRITE2 is output from the processor 6 at a time of data output after a predetermined time has passed from the output of the first write signal WRITE1. At this time t3, since the first write signal WRITE (see FIG. 3 (6)) is not generated, the output data D3–D0 that is "0001" at this time are not latched in the flip-flops 31–34, but the previous data "1000" is held in the flip-flops 31–34. On the other hand, in response to the second write signal WRITE2, the output data D0 that is "1" at this time is latched in the flip-flop 42. As a result, since the output of the flip-flop 42 becomes "H" level and the enable signal EN is "1", the output of the gate 25 becomes "H" level so that the output data "000" of the flip-flops 32–34 pass through the gates 22–24 and the gates 26–28 to be latched in the flip-flops 201–203. Thus the output signals CK2–CK0 of the flip-flops 201–203 becomes "000" which are the lower three bits of the output data "1000" of the flip-flops 31–34 (see FIG. 3 (5)). The PLL section 1 receives the signals CK2–CK0 ("000") to convert the internal clock signal into a signal having a frequency with a multiplication rate corresponding to the signals "000" (for example, the same frequency as that of the external clock signal).

On the other hand, since the output of the flip-flop 42 is at the "H" level (see FIG. 3 (9)) and the enable signal EN is at the "H" level, the output of the AND gate 44 becomes the "H" level. This "H" level signal is latched by the flip-flop 45 so that its output (b) is turned to "H" level (see FIG. 3 (10)). In response to the rise of the output (b), the timer 46 starts to operate so that, after a predetermined time necessary for the output of the PLL section 1 is locked to the internal clock signal with the above-mentioned multiplication rate to be stable, an "L" level signal is output from the timer 46 (see FIG. 3 (11)). In response to the timer output pulse, the output of the AND gate 43 becomes the "H" level so that the flip-flop 42 is reset.

While the output of the flip-flop 42 is at the "H" level (see FIG. 3 (9)), the output of the OR gate 5 is kept at the "H" level, and the "H" level signal from the output of the flip-flop 42 is supplied as the operation inhibiting signal to each unit in the processor 6. When the above-mentioned predetermined time has passed, the flip-flop 42 is reset so that the inhibiting signal is released, allowing the internal clock signal with the changed multiplication rate to be supplied to the processor 6.

From the above description of the operation, it will be understood that the multiplication rate of the internal clock signal of both the PLL section 1 and the processor 6 can be lowered.

In the above-described embodiment, the least significant bit D0 of the output data from the processor 6 is used as the operation inhibit signal for the processor 6, however, it should be noted that, according to the design of the processor 6, any bit in the output data may be used as the operation inhibit signal for the processor 6.

In the above-described embodiment, the enable signal EN is turned to "1" at the time t2. In the following, a case when the enable signal EN is turned to "0" at a time t4 will be described.

At the time t4, when the output data D3–D0 are changed to "0111", and the first write signal WRITE pulse for writing these data into the flip-flops 31–34 is generated, the first write signal WRITE at the time t4 is at the "H" level, so that the external clock signal EXT.CLK passes through the AND gate 35. In response to the external clock signal EXT.CLK, the output data "0111" are latched in the flip-flops 31–34. In this case, however, since the most significant bit D3 is "0", the enable signal EN is "0" so that the outputs of the flip-flops 32–34 cannot pass through the gates 22–24. Also, since the reset signal RST bar is at the "L" level at the time t4, the external clock selecting signals CLKSEL2–CLKSEL0 cannot pass through the gates 22–24. Accordingly, the flip-flops 201–203 continue to hold the previous values so that the signal CK2–CK0 remain to be "000" (see FIG. 3 (5)). Thus, when the most significant bit of the output data of the processor is "0", the frequency of the internal clock signal for the PLL section 1 is not changed.

In this situation, at a time t5, it is assumed that the output data of the processor 6 is changed to "0001", and the second write signal WRITE 2 is generated as an "H" level pulse. Since the second write signal WRITE2 is at the "H" level, the external clock signal CLK passes through the AND gate 41 to be input into the clock terminal of the flip-flop 42, the least significant bit D0 that is "1" at this time is latched in the flip-flop 42 in response to the external clock signal (see FIG. 3 (9)). However, since the enable signal EN is "0" at this time, the output (b) of the AND gate 44 is not turned to the "H" level so that the timer 46 does not start to operate. Therefore, from the time t5 to a time when the second reset signal RRST bar is turned to the "L" level, the "H" level output of the flip-flop 42 continues to be supplied to each unit in the processor 6 so that the internal clock signal from the PLL section is not supplied to the processor 6.

At a time t6, when an "L" level pulse is supplied as the second reset signal RRST bar, the flip-flop 42 is reset to turn its output to the "L" level, allowing the internal clock signal output from the PLL section 1 to be supplied to the processor 6. The above-mentioned "L" level second reset signal RRST bar pulse is externally supplied by a user at any time when the user wishes to use the processor 6.

Next, a description will be given for a case when the frequency of the internal clock signal of the PLL section 1 is increased.

At a time t7, it is assumed that the output data D3–D0 from the processor 6 are changed to "1111", and an "H" level pulse of the first write signal WRITE is output from the processor 6. Then the flip-flops 31–34 latch this data D3–D0 that are "1111" at this time. As a result, the output of the enable signal EN is turned to "1" so that the outputs "111" of the flip-flops 32–34 pass through the gates 22–24. At this time, however, since the output of the flip-flop 42 is at the "L" level, one input of the AND gate in the gate 25 is kept to be at the "L" level. The reset signal RST bar is also kept to be at the "H" level. Therefore, the outputs of the gates 22–24 do not pass through the gates 26–28. As a result, the output signals CK2–CK0 of the flip-flops 201–203 remain at "000".

Then, at a time t8, it is assumed that the output data D3–D0 from the processor 6 is changed to "0001", and the second write signal WRITE2 is output from the processor 6 (see FIG. 3 (7)). At this time, since the first write signal WRITE (FIG. 3 (6)) is at the "L" level, the output data D3–D0 that is "0001" at this time are not latched in the flip-flops 31–34, but the flip-flops 31–34 hold the previous data "1111". In response to the "H" level of the second write signal WRITE2, the data D0 that is "1" at this time is latched in the flip-flop 42. Since the output of the flip-flop 42 is at the "H" level and the enable signal EN is "1", the output of the gate 25 is turned to the "H" level, so that the output data "111" from the flip-flops 32–34 pass through the gates 22–24 and the gates 26–28 to be latched in the flip-flops 201–203. As a result, the output signals CK2–CK0 from the flip-flops 201–203 are the lower three bits "111" of the output data "1111" from the flip-flops 31–34. The PLL section 1 receives these signals CK2–CK0, i.e., "111", to convert the internal clock signal into a signal having a frequency with a multiplication rate corresponding to these signals CK2–CK0. For example, the frequency of the internal clock signal is set to the maximum frequency which is eight times the frequency of the external clock signal.

On the other hand, the operation to inhibit the operation of the processor 6 by means of the internal clock signal output from the processor 6 until the frequency of the output signal from the PLL section becomes stable is the same as the operation described before with respect to the time t3, and therefore the explanation is omitted here.

In the above-described embodiments, the enable signal EN is obtained from the most significant bit in the output data from the processor 6, however, it should be noted that the present invention is not limited to this. The enable signal may be obtained from any bit corresponding to the case when the frequency of the internal clock signal must be changed, in accordance with the design of the processor 6.

In the above-described embodiments also, the bit used to start the operation of the timer is the least significant bit of the output data, however, any bit may be used for that bit in accordance with the processor design. Further, the output data of the processor 6 are not limited to four bits.

From the foregoing description, it is apparent that, according to the present invention, by changing the multiplication rate of the internal clock signal used in the PLL section in accordance with the frequency of the internal clock signal used in the processor, the power consumption of the microprocessor can be greatly reduced.

What is claimed is:

1. A microprocessor with reduced power consumption in accordance with its usage condition, comprising:

a PLL section to generate and output an internal clock signal based on an external clock signal, said PLL section begin operated in accordance with said internal clock signal;

a processor to execute an instruction in accordance with said internal clock signal output by said PLL section;

an instructing section to latch data output from said processor by the execution of said instruction, to output a frequency multiplication rate instructing signal corresponding to said latched data and, to output an enable signal to indicate whether a multiplication rate of the internal clock signal should be changed;

a data selecting section to selectively output said frequency multiplication rate instructing signal or an external clock selecting signal in accordance with said enable signal;

an inhibiting section to inhibit said internal clock signal output by said PLL section from being supplied to said processor for a predetermined period from a time of the output of said enable signal to a time when the frequency of said internal clock signal in said PLL section becomes stable; and a frequency changing unit, provided in said PLL section, to change the frequency of said internal clock signal in response to the data selectively output from said data selecting section.

2. A microprocessor as claimed in claim 1, wherein said instructing section comprises a register to latch the data output from said processor.

3. A microprocessor as claimed in claim 1, wherein said data selecting section comprises means for outputting said external clock selecting signal when a reset time is detected and when said enable signal does not indicate that the multiplication rate should be changed.

4. A microprocessor as claimed in claim 1, wherein said PLL section comprises means for changing the frequency of said internal clock signal in accordance with said frequency multiplication rate instructing signal while said inhibiting section inhibits supply of said internal clock signal.

5. An apparatus, comprising:

a processor to execute an instruction and output data in accordance with an internal clock signal;

an instructing section to generate an instructing signal indicating a one of plural frequency multiplication rates for the internal clock signal, the indicated frequency multiplication rate corresponding to the data output by said processor;

a PLL section to generate and output the internal clock signal in response to an external clock signal and to operate in accordance with the internal clock signal, said PLL section generating the internal clock signal to have the indicated frequency multiplication rate and changing the internal clock signal to the indicated frequency multiplication rate from a previous frequency multiplication rate when the indicated frequency multiplication rate differs from the previous frequency multiplication rate; and an inhibiting section to inhibit the internal clock signal output by said PLL section from being supplied to said processor when said PLL section changes the internal clock signal from the previous frequency multiplication rate to the indicated frequency multiplication rate, said inhibiting section inhibiting supply of the internal clock signal until the frequency of the internal clock signal output by said PLL section becomes stable.

6. An apparatus, comprising:

a processor to execute an instruction and output data in accordance with an internal clock signal;

a selecting section to select and output one of an instructing signal and an external clock selecting signal, the instructing signal indicating a selected frequency multiplication rate for the internal clock signal and the external clock selecting signal indicating a predetermined constant frequency multiplication rate for the internal clock signal, the selected frequency multiplication rate corresponding to the data output by said processor;

a PLL section to generate and output the internal clock signal in response to an external clock signal and to operate in accordance with the internal clock signal, said PLL section generating the internal clock signal to have the indicated frequency multiplication rate and changing the internal clock signal to the indicated frequency multiplication rate from a previous frequency multiplication rate when the indicated frequency multiplication rate differs from the previous frequency multiplication rate; and an inhibiting section to inhibit the internal clock signal output by said PLL section from being supplied to said processor when the indicated frequency multiplication rate is the selected frequency multiplication rate, said inhibiting section inhibiting supply of the internal clock signal to said processor until the frequency of the internal clock signal output by said PLL section becomes stable.

* * * * *